US012787458B2

(12) United States Patent
Hsu et al.

(10) Patent No.: US 12,787,458 B2
(45) Date of Patent: Nov. 3, 2026

(54) SILICON ULTRAVIOLET PHOTODIODE AND MANUFACTURING METHOD THEREOF

(71) Applicant: PixArt Imaging Incorporation, Hsinchu (TW)

(72) Inventors: Hsin-Hui Hsu, Hsinchu (TW); Chen-Chung Chou, Hsinchu (TW)

(73) Assignee: PixArt Imaging Incorporation, Hsinchu (TW)

( * ) Notice: Subject to any disclaimer, the term of this patent is extended or adjusted under 35 U.S.C. 154(b) by 357 days.

(21) Appl. No.: 18/666,718

(22) Filed: May 16, 2024

(65) Prior Publication Data

US 2025/0359356 A1 Nov. 20, 2025

(51) Int. Cl.

| | |
|---|---|
| ***H10F 30/221*** | (2025.01) |
| ***H10F 71/00*** | (2025.01) |
| ***H10F 77/00*** | (2025.01) |
| ***H10F 77/122*** | (2025.01) |

(52) U.S. Cl.

CPC ......... *H10F 30/221* (2025.01); *H10F 71/128* (2025.01); *H10F 77/122* (2025.01); *H10F 77/933* (2025.01)

(58) Field of Classification Search

CPC .... H10F 30/221; H10F 71/128; H10F 77/122; H10F 77/933; H10F 30/24; H10F 71/121

See application file for complete search history.

(56) References Cited

U.S. PATENT DOCUMENTS

2011/0032766 A1* 2/2011 Fang ...................... H10B 43/10 257/E21.409

* cited by examiner

*Primary Examiner* — Mohammad A Rahman
(74) *Attorney, Agent, or Firm* — Tung & Associates

(57) ABSTRACT

The present invention provides a silicon ultraviolet photodiode and a manufacturing method thereof. The silicon ultraviolet photodiode includes: an N-type region formed beneath and in contact with an upper surface of a silicon substrate; a P+ region formed beneath and in contact with the N-type region; a deep N-well region formed beneath and in contact with the P+ region; and an N-type conductive channel, which is connected to the deep N-well region, and is configured to operably drain a non-ultraviolet current caused by electron-hole pairs formed in the deep N-well region; wherein a depth of the N-type region is controlled to a predetermined depth to enhance an ultraviolet sensitivity by compensating N-type dopant impurities of an N-type implantation region by out-diffused P-type dopant impurities of a P+ implantation region through a thermal process step.

13 Claims, 10 Drawing Sheets

SILICON ULTRAVIOLET PHOTODIODE AND MANUFACTURING METHOD THEREOF

BACKGROUND OF THE INVENTION

Field of Invention

The present invention relates to a silicon ultraviolet photodiode. Particularly, it relates to such silicon ultraviolet photodiode which can control a depth of an N-type region to a predetermined depth. The present invention also relates to a manufacturing method of the silicon ultraviolet photodiode.

Description of Related Art

Ultraviolet (UV) light sensors are instrumental in various industrial applications due to their sensitivity to ultraviolet (UV) light. One common use is in the curing processes where UV light is employed to harden adhesives and coatings. In these applications, the UV light sensors play a crucial role in monitoring the intensity of UV light. This is essential to ensure that the curing process is effective and consistent, preventing under or over-exposure which could compromise the quality of the final product. By accurately sensing UV light intensity, the UV light sensors help maintain process reliability and product quality in industries where precision is paramount.

Traditionally, UV light sensors can be manufactured using substrates from III-V compound semiconductors, silicon, or silicon carbide. Various semiconductor substrates are suitable for manufacturing UV light sensors. However, when fabricating UV sensors with materials other than silicon, it is necessary to select a semiconductor material with a higher band gap, which may not effectively detect light with wavelengths longer than those of UV light. The benefit of using the semiconductor materials with higher band gap for the UV sensors is that they do not require an additional filter to block longer wavelengths of light. However, the drawback is that UV light sensors formed from the semiconductor materials with higher band gap cannot be manufactured on a same substrate with circuit elements manufactured in a silicon substrate. This necessitates the use of two separate substrates (one semiconductor substrate with higher band gap, one silicon substrate). Whether using substrates from III-V compounds or silicon carbide, these high band gap materials still require an additional silicon substrate to manufacture other circuits, resulting in the creation of two chips and thereby increasing manufacturing costs.

FIG. 1 shows a cross-sectional schematic diagram of a prior art silicon ultraviolet photodiode as a UV light sensor. A silicon ultraviolet photodiode 10 includes an N-type region 12 formed in a P-type silicon substrate 11, a contact plug V, a metal line M1, and a filter 14. In the silicon ultraviolet photodiode 10, a PN junction 15 is formed between the N-type region 12 and the P-type silicon substrate 11. A gate 13, another contact plug V and another metal line M1 indicate other circuits formed in the P-type silicon substrate 11.

Using the P-type silicon substrate 11 for the silicon ultraviolet photodiode 10 presents a unique set of challenges and limitations primarily due to the material's inherent properties. The fundamental issue with silicon is that its bandgap is approximately 1.12 eV, allowing it to sense a broad range of wavelengths from UV light to near-infrared light. This wide sensitivity can be problematic if the goal is to sense only UV lights, as other wavelengths may interfere. This necessitates the use of a robust filter, i.e., the filter 14 above the N-type region 12 of a silicon ultraviolet photodiode 10 shown in FIG. 1, to block visible light of an incident light LT1, which unfortunately also tends to reduce the transmission of UV light, further complicating UV light sensor design.

Still referring to FIG. 1, FIG. 1 shows the silicon ultraviolet photodiode 10 for sensing a UV light intensity of the incident light LT1. When the silicon ultraviolet photodiode 10 receives the incident light LT1, the filter 14 filters out most of the light frequencies below UV light range, to generate a filtered light LT2. A drawback of this prior art is that while the filter 14 filters out most of the light frequencies below UV light from the incident light LT1, it also significantly reduces the transmission of UV light. In the silicon ultraviolet photodiode 10, a transmission rate of UV light may be less than 10%, resulting in a reduced sensitivity of the silicon ultraviolet photodiode 10 to UV light.

Additionally, UV light, characterized by its short wavelength and high energy, interacts with silicon by quickly generating electron-hole pairs. This interaction typically intends to occur at very shallow depths within the P-type silicon substrate 11, which is a distinctive feature that differentiates the silicon ultraviolet photodiode from other types of photodetectors. In the conventional silicon ultraviolet photodiodes, such as those based on deeper PN junctions, struggle with these issues. They require better filtering to mitigate the effects of visible light, leading to lower UV transmission rates, and their deeper PN junctions tend to have reduced sensitivity to UV light. Thus, employing silicon for UV sensing requires overcoming these traditional challenges to optimize performance.

In view of the above, the present invention proposes an innovative silicon ultraviolet photodiode and a manufacturing method thereof to overcome the drawbacks in the prior art.

SUMMARY OF THE INVENTION

From one perspective, the present invention provides a silicon ultraviolet photodiode, configured to operably sense an ultraviolet light of an incident light irradiating onto the silicon ultraviolet photodiode, the silicon ultraviolet photodiode comprising: an N-type region formed beneath and in contact with an upper surface of a silicon substrate; a P+ region formed beneath and in contact with the N-type region; a deep N-well region formed beneath and in contact with the P+ region; and an N-type conductive channel, which is connected to the deep N-well region, and is configured to operably drain a non-ultraviolet current caused by electron-hole pairs generated by the incident light; wherein a depth of the N-type region is controlled to a predetermined depth to enhance an ultraviolet sensitivity by compensating N-type dopant impurities of an N-type implantation region by out-diffused P-type dopant impurities of a P+ implantation region through a thermal process step.

From another perspective, the present invention provides a manufacturing method of a silicon ultraviolet photodiode, wherein the silicon ultraviolet photodiode is configured to operably sense an ultraviolet light of an incident light irradiating onto the silicon ultraviolet photodiode, the manufacturing method comprising: providing a silicon substrate; forming a deep N-well region in the silicon substrate; forming an N-type implantation region beneath and in contact with an upper surface of the silicon substrate;

forming a P+ implantation region above the deep N-well region and below the N-type implantation region; performing a thermal process step to out-diffuse P-type dopant impurities of the P+ implantation region to compensate N-type dopant impurities of the N-type implantation region to form an N-type region and a P+ region, so as to control a depth of the N-type region to a predetermined depth to enhance an ultraviolet sensitivity; and forming an N-type conductive channel, which is connected to the deep N-well region, and is configured to operably drain a non-ultraviolet current caused by electron-hole pairs generated by the incident light; wherein the N-type region is beneath and in contact with an upper surface of the silicon substrate; wherein the P+ region is beneath and in contact with the N-type region; wherein the deep N-well region is beneath and in contact with the P+ region.

In one preferred embodiment, the silicon ultraviolet photodiode further includes an ultraviolet contact plug, which is formed on the upper surface and in contact with the N-type region, wherein the ultraviolet contact plug is configured to operably collect an ultraviolet current caused by electron-hole pairs generated by the incident light.

In one preferred embodiment, the N-type region is configured to operably receive a UVA light with a wave length not larger than 400 nm and not less than 320 nm, a UVB light with a wave length less than 320 nm and not less than 280 nm, and/or a UVC light with a wave length less than 280 nm and not less than 100 nm.

In one preferred embodiment, the predetermined depth is less than 10 nm.

In one preferred embodiment, the silicon ultraviolet photodiode does not comprise a filter for filtering out a visible signal and/or an IR signal.

In one preferred embodiment, the N-type implantation region is formed beneath and in contact with an upper surface of the silicon substrate; wherein the P+ implantation region is formed above the deep N-well region and below the N-type implantation region; wherein the N-type region and the P+ region are formed by performing the thermal process step to form the N-type region and the P+ region.

In one preferred embodiment, a first PN junction is formed between the N-type region and the P+ region to sense the ultraviolet current; wherein a second PN junction is formed between the P+ region and the deep N-well region to sense the non-ultraviolet current.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1:
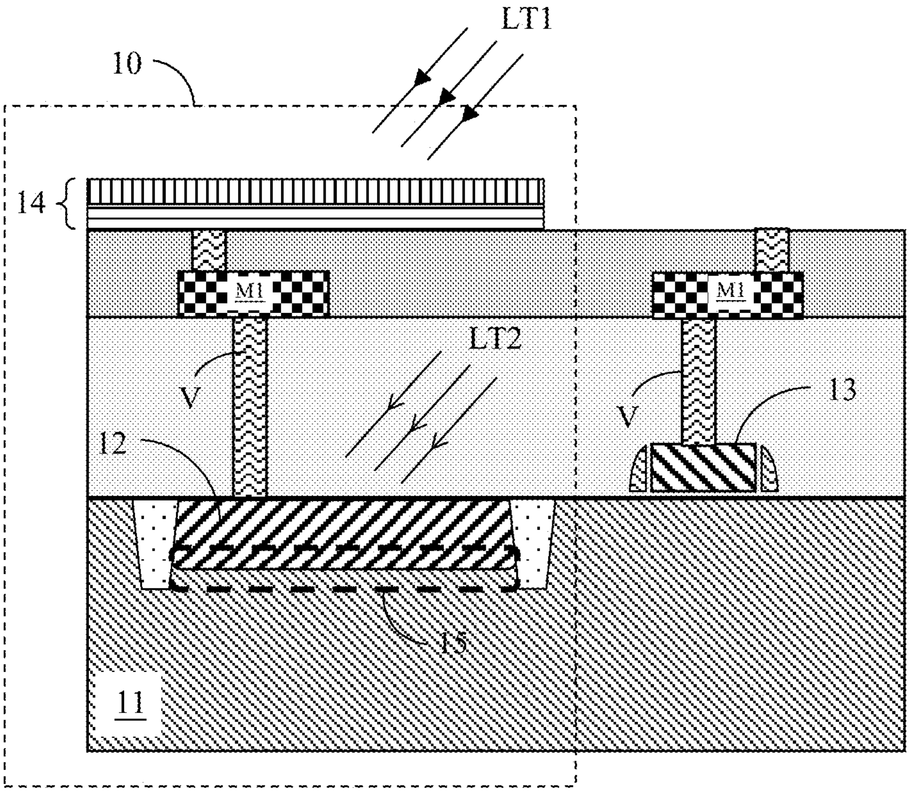
Fig. 1 (prior art)
FIG. 1 shows a cross-sectional schematic diagram of a prior art silicon ultraviolet photodiode.
Figure 2:
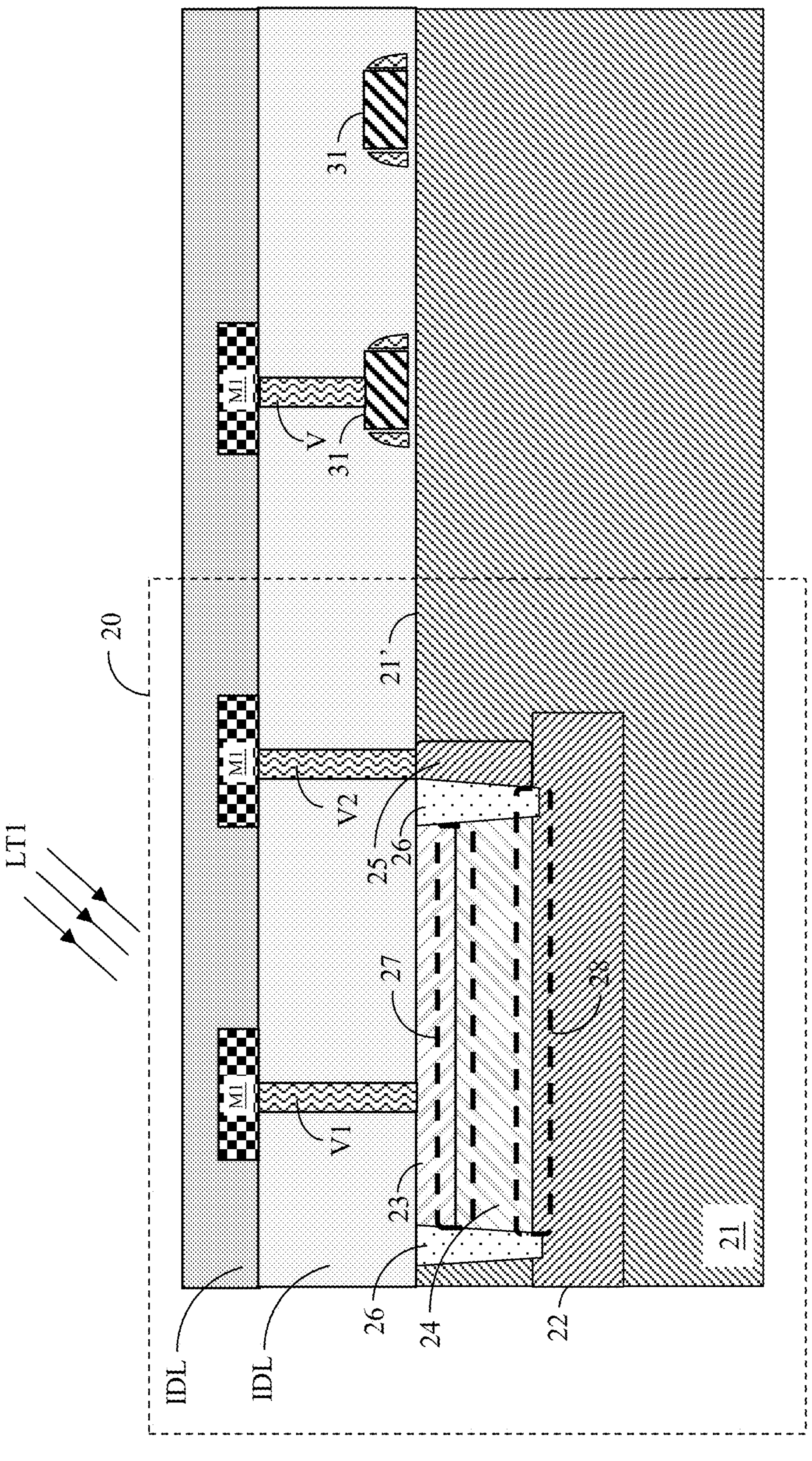
FIG. 2 shows a cross-sectional schematic diagram of an embodiment of a silicon ultraviolet photodiode according to the present invention.

FIG. 2 shows a cross-sectional schematic diagram of a silicon ultraviolet photodiode according to one embodiment of the present invention. As shown in FIG. 2, a silicon ultraviolet photodiode 20 according to the present invention is configured to operably sense an ultraviolet light of an incident light LT1 irradiating onto the silicon ultraviolet photodiode 20. The silicon ultraviolet photodiode 20 includes: a deep N-well region 22, an N-type region 23, a P+ region 24 and an N-type conductive channel 25. The N-type region 23 is formed beneath and in contact with an upper surface 21' of a silicon substrate 21. The P+ region 24 is formed beneath and in contact with the N-type region 23. The deep N-well region 22 is formed beneath and in contact with the P+ region 24. The N-type conductive channel 25 is connected to the deep N-well region 22, and is configured to operably drain a non-ultraviolet current caused by electron-hole pairs generated by the incident light LT1. In this embodiment, a depth of the N-type region 23 is controlled to a predetermined depth to enhance an ultraviolet sensitivity by compensating N-type dopant impurities of an N-type implantation region by out-diffused P-type dopant impurities of a P+ implantation region through a thermal process step.

Still referring to FIG. 2, the silicon ultraviolet photodiode 20 further comprises an ultraviolet contact plug V1, which is formed on the upper surface 21' and in contact with the N-type region 23, wherein the ultraviolet contact plug V1 is configured to operably collect an ultraviolet current caused by electron-hole pairs generated by the incident light LT1.

In one embodiment, the N-type region 23 is configured to operably receive a UVA light with a wave length not larger than 400 nm and not less than 320 nm, a UVB light with a wave length less than 320 nm and not less than 280 nm, and/or a UVC light with a wave length less than 280 nm and not less than 100 nm.

In one embodiment, he predetermined depth is less than 10 nm.

In one embodiment, the silicon ultraviolet photodiode 20 does not comprise a filter for filtering out a visible signal and/or an IR signal. Note that, the visible signal and/or an IR signal indicates a light(s) with a wavelength larger than 400 nm. In this embodiment, the incident light LT1 is not filtered by the filter, and a transmission rate of UV light may be larger than 60%, resulting in an increased sensitivity of the silicon ultraviolet photodiode 20 to UV light.

In one embodiment, the N-type implantation region is formed beneath and in contact with an upper surface 21' of the silicon substrate 21; wherein the P+ implantation region is formed above the deep N-well region and below the N-type implantation region; wherein the N-type region 23 and the P+ region 24 are formed by performing the thermal process step.

In one embodiment, a first PN junction 27 is formed between the N-type region 23 and the P+ region 24 to sense the ultraviolet current; wherein a second PN junction 28 is formed between the P+ region 24 and the deep N-well region 22 to sense the non-ultraviolet current.

According to the present invention, the predetermined depth is determined as the first PN junction 27 at a relatively shallower depth, which is a depth where electron-hole pairs are maximally generated by the UV light in the incident light LT1, resulting in the highest UV current. This enhances the sensitivity of the silicon ultraviolet photodiode 20 to UV light. For light in the incident light LT1 with wavelengths longer than UV light, which generates electron-hole pairs at deeper depths, a second PN junction 28 is arranged at a deeper depth. This allows the current generated by light with wavelengths exceeding that of UV light to be directed via the electrical connection to the N-pole of the second PN junction, i.e., the deep N-well region 22. This design differentiates a current generated by longer wavelengths from the UV current as separate electronic signals without the need for a filter on the upper surface 21' of the silicon substrate 21 to reduce the transmission rate of UV light, thus improving the sensitivity of the silicon ultraviolet photodiode 20 to UV light. In other words, according to the present invention, PN junctions at different depths can be designed to target light of specific wavelengths, thereby distinguishing the light to be measured from other lights with different wavelengths.

Still referring to FIG. 2, the N-type region 23 and the P+ region 24 in the silicon ultraviolet photodiode 20 are formed through a thermal process step. The thermal process step aims to control the depth of the N-type region 23 to a predetermined depth by compensating for N-type dopant impurities of an N-type implantation region with out-diffused P-type dopant impurities from a P+ implantation region. This design results in the first PN junction 27 located at a relatively shallow depth and enhances ultraviolet sensitivity, enabling more effective guidance and collection of UV light induced current when the incident light LT1 irradiates onto the silicon ultraviolet photodiode 20. Additionally, this design also helps to improve the overall efficiency and sensitivity of the silicon ultraviolet photodiode 20, especially under high ultraviolet light intensity.

Furthermore, the silicon ultraviolet photodiode 20 may not comprise a filter to filter out visible and/or infrared lights, or in other words, a light with a wave length larger than 400 nm. The present invention allows the photodiode to focus on detecting within the ultraviolet range, avoiding performance degradation due to interference from visible light or infrared rays. This makes the silicon ultraviolet photodiode 20 perform better in applications requiring high ultraviolet sensitivity and specificity, such as in scientific research, medical diagnostics, and industrial testing.

FIGS. 3A-3H are schematic diagrams showing a manufacturing method of the silicon ultraviolet photodiode 20 according to the present invention.

Figure 3A:
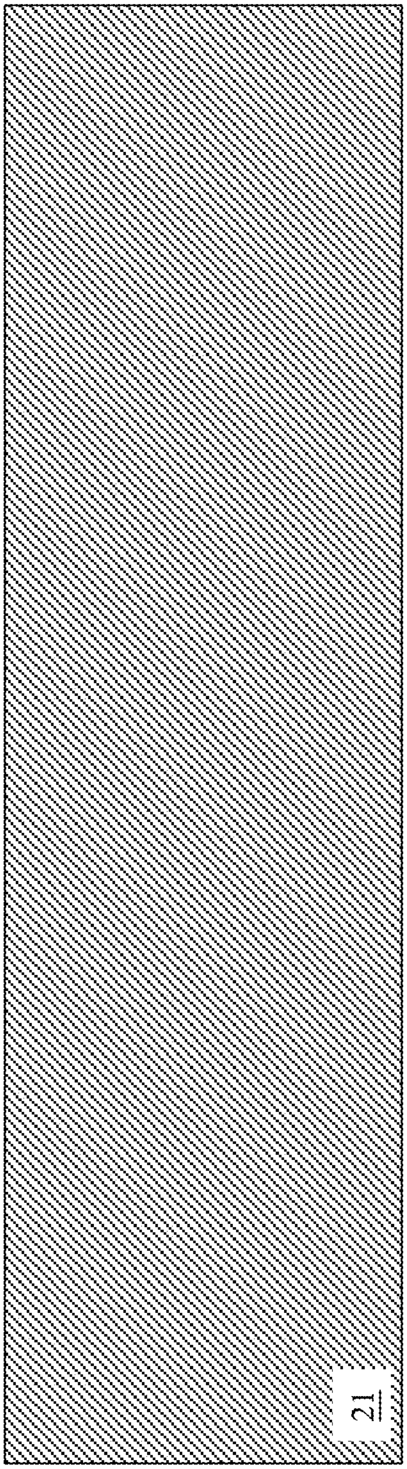
FIGS. 3A-3H are schematic diagrams showing a manufacturing method of a silicon ultraviolet photodiode according to the present invention.

First, as shown in FIG. 3A, a silicon substrate 21 is provided. In one embodiment, the silicon substrate 21 is a P-type silicon substrate.

Figure 3B:
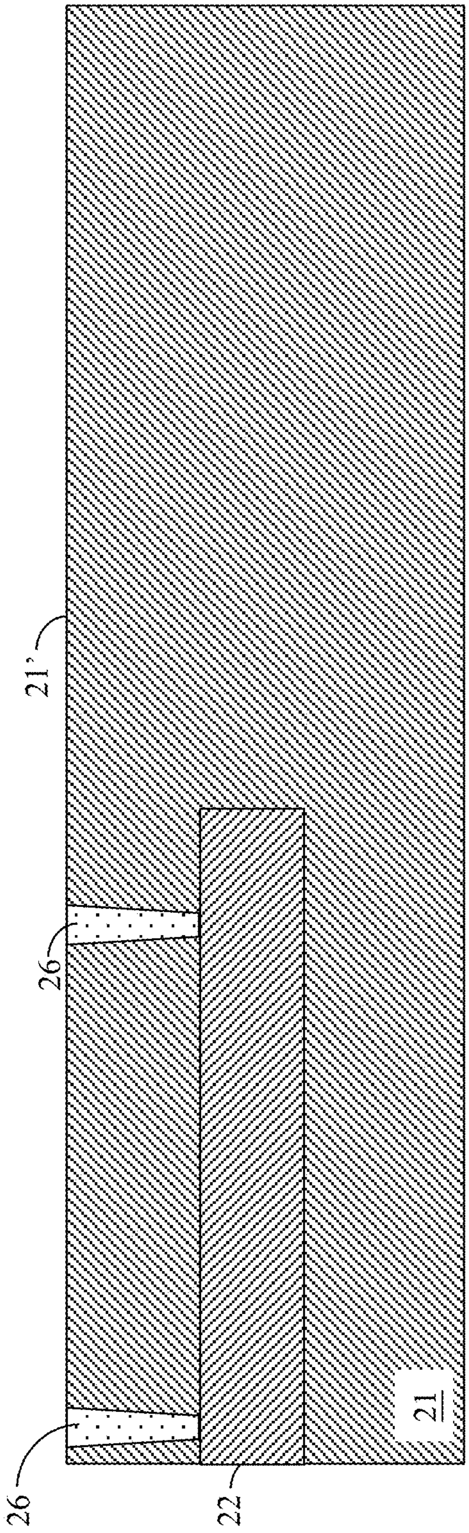

Next, as shown in FIG. 3B, for example, insulation regions 26 and the deep N-well region 22 are formed in the silicon substrate 21. The insulation region 26 is configured to operably electrically isolate corresponding regions in the silicon substrate 21, and is for example but not limited to a shallow trench isolation (STI) structure as shown in FIG. 3B. The deep N-well region 22 for example is formed by an ion implantation process step, and is located beneath the insulation regions 26.

Figure 3C:
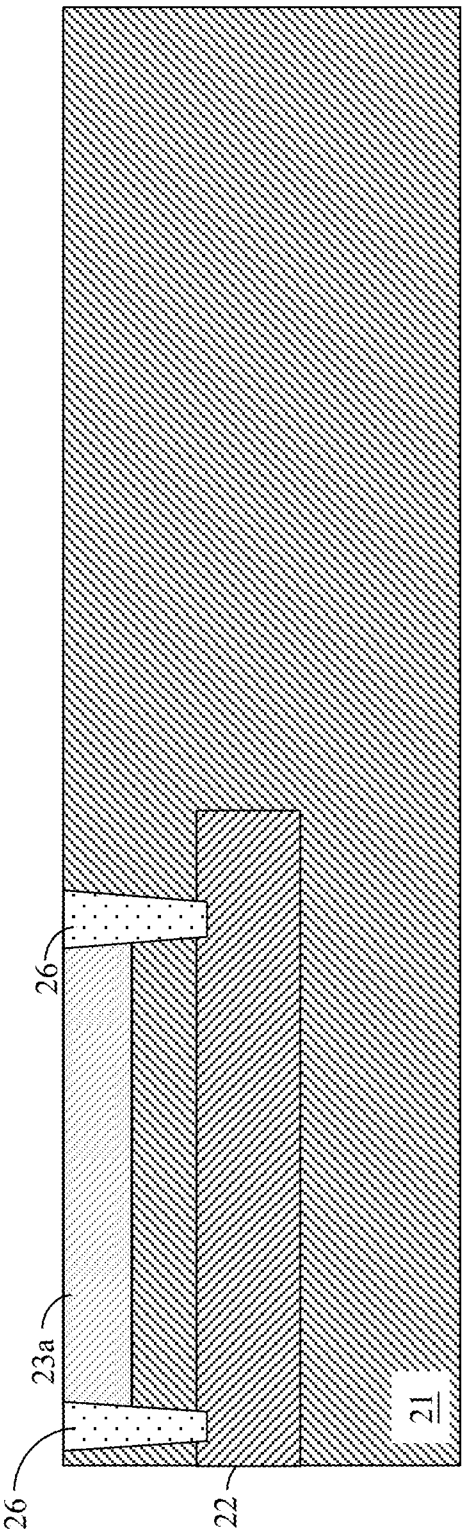

Then, as shown in FIG. 3C, an N-type implantation region 23*a* beneath and in contact with the upper surface 21' of the silicon substrate 21 is formed. The N-type implantation region 23*a* can be formed by steps including, for example but not limited to, a lithography process and an ion implantation step, wherein the lithography process includes forming a photo-resist layer as a mask and the ion implantation step dopes N-type conductivity type impurities into the silicon substrate 21, to form the N-type implantation region 23*a*.

Figure 3D:
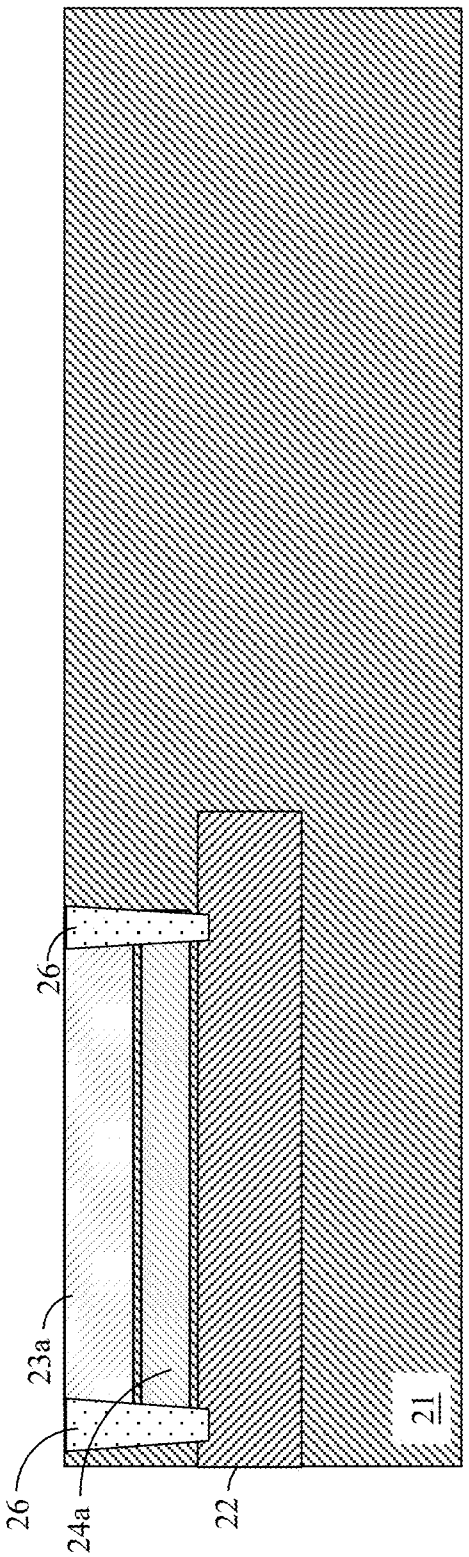

Then, as shown in FIG. 3D, a P+ implantation region 24*a* above the deep N-well region 22 and below the N-type implantation region 23*a* is formed. The P+ implantation region 24*a* can be formed by steps including, for example but not limited to, a lithography process and an ion implantation step, wherein the lithography process includes forming a photo-resist layer as a mask and the ion implantation step dopes P-type conductivity type impurities into the silicon substrate 21, to form the P+ implantation region 24*a*, wherein the lithography process can be the same lithography process as the lithography process of the N-type implantation region 23*a*, i.e., the N-type implantation region 23*a* and the P+ implantation region 24*a* may share the same lithography process.

Figure 3E:
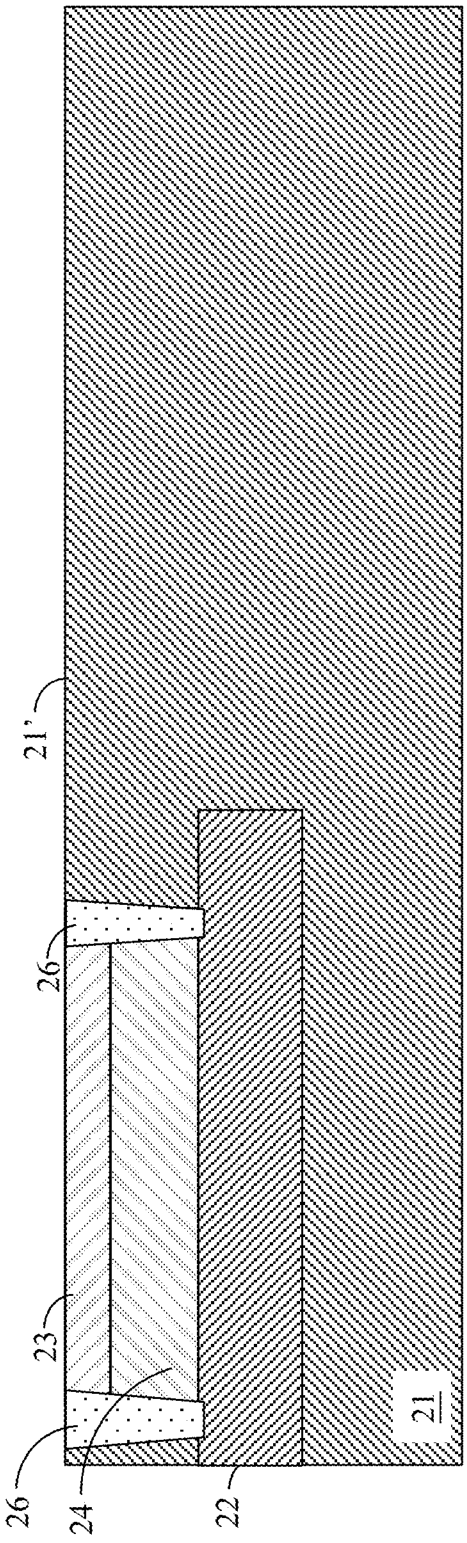

Then, as shown in FIG. 3E, a thermal process step is performed to out-diffuse P-type dopant impurities of the P+ implantation region 24*a* to compensate N-type dopant impurities of the N-type implantation region 23*a* to form the N-type region 23 and the P+ region 24, so as to control the depth of the N-type region 23 to a predetermined depth to enhance the ultraviolet sensitivity. The N-type region 23 is beneath and in contact with the upper surface 21' of the silicon substrate 21. The P+ region 24 is beneath and in contact with the N-type region 23. The deep N-well region 22 is beneath and in contact with the P+ region 24.

Figure 3F:
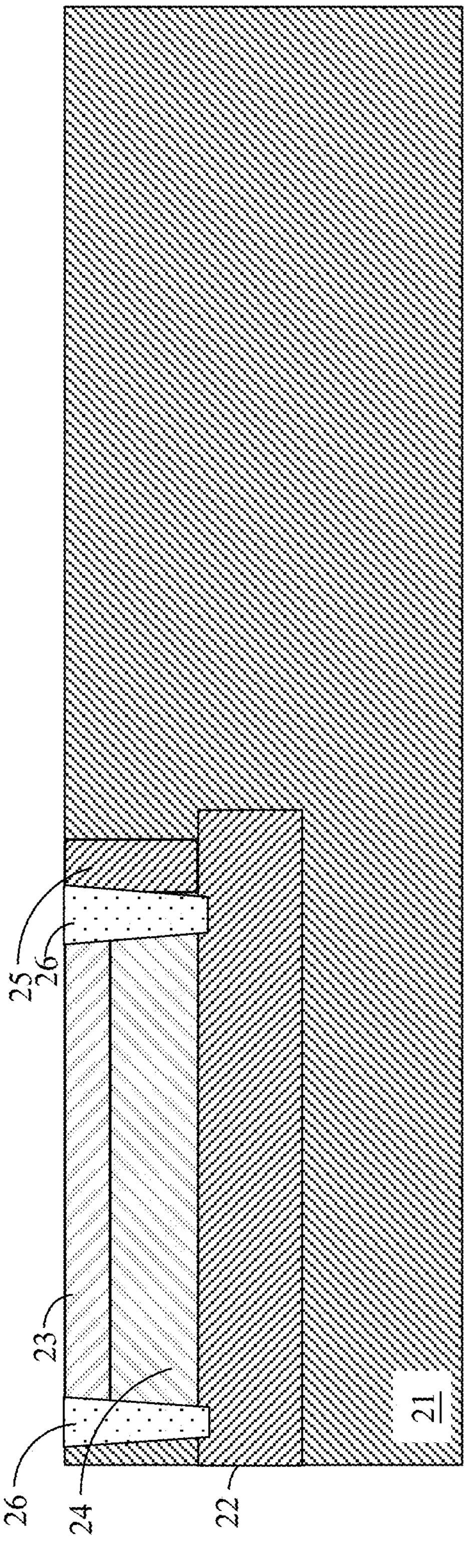

Then, as shown in FIG. 3F, the N-type conductive channel 25 is formed. The N-type conductive channel 25 is connected to the deep N-well region 22, and is configured to operably drain a non-ultraviolet current caused by electron-hole pairs generated by the incident light LT1. The insulation regions 26 electrically isolates the N-type conductive channel 25 from the P+ region 24 and the N-type region 23 in the silicon substrate 21.

Figure 3G:
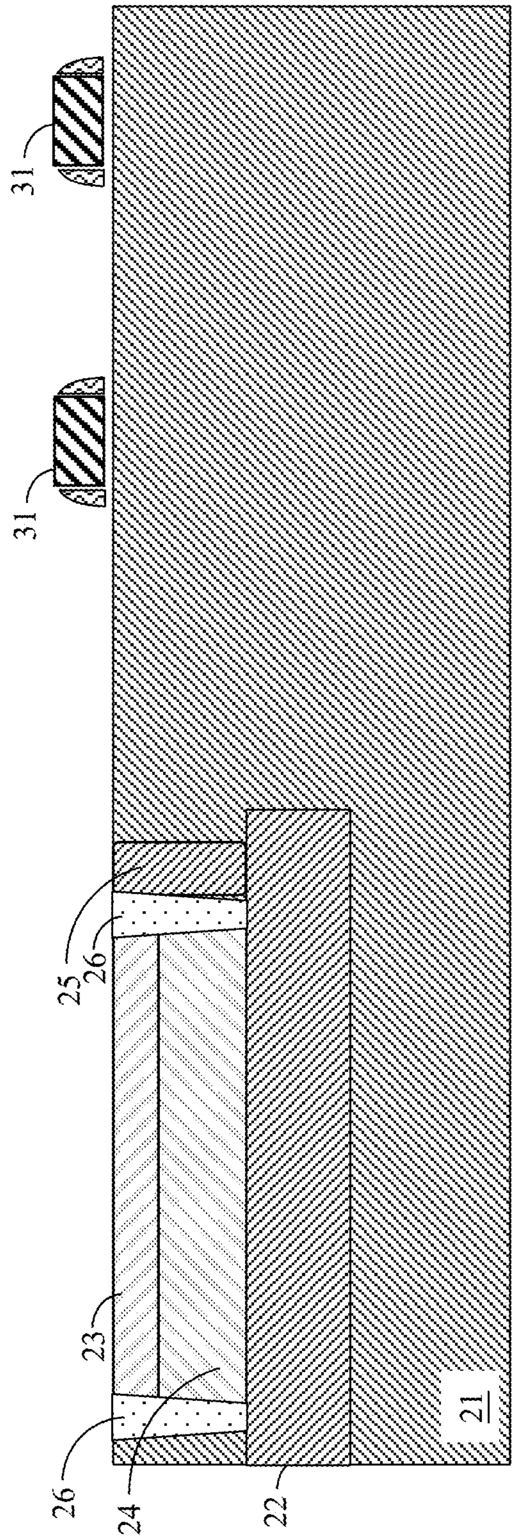

Then, as shown in FIG. 3G, gates 31 are formed on the upper surface 21' of the silicon substrate 21 outside a range of the silicon ultraviolet photodiode 20.

Figure 3H:
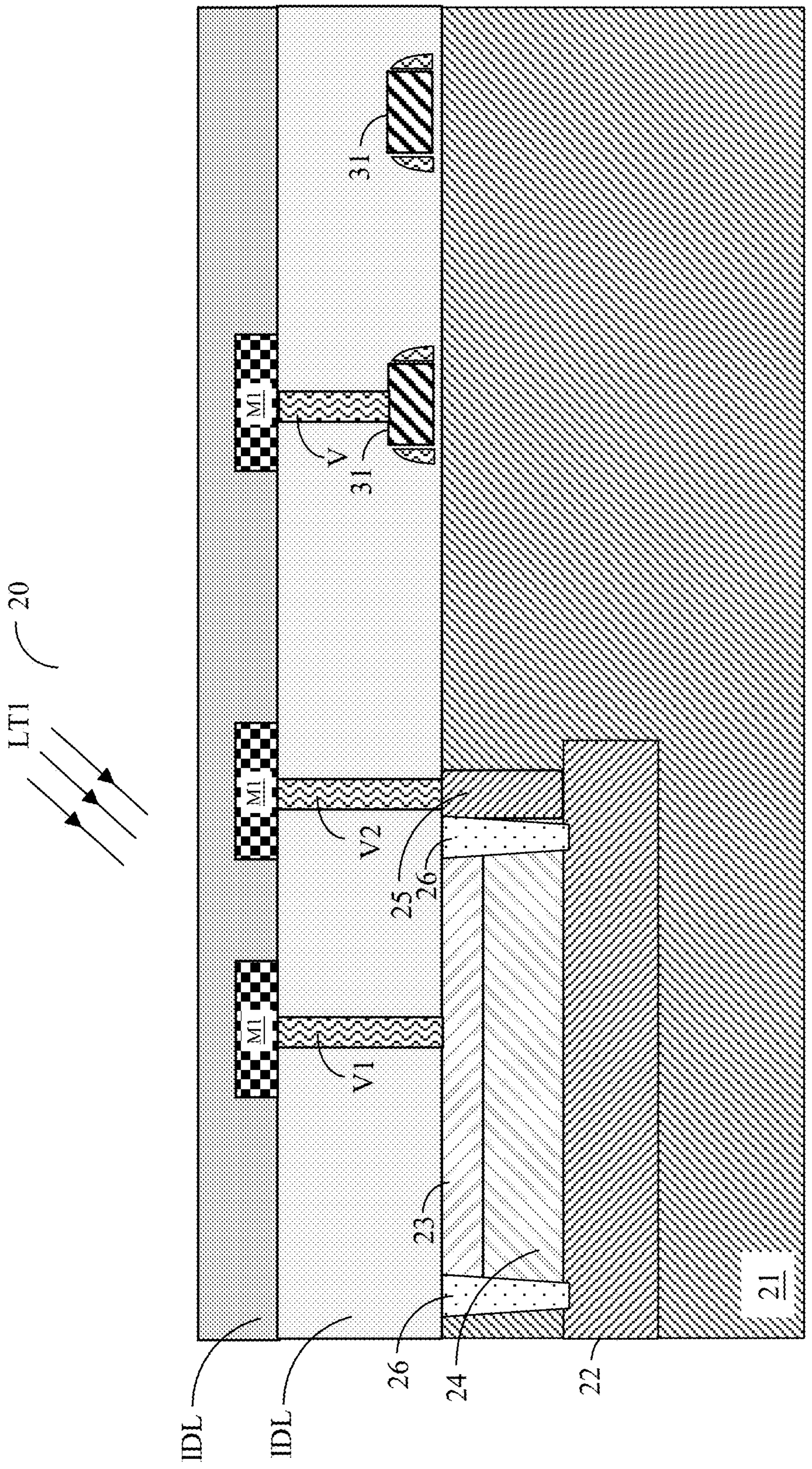

Then, as shown in FIG. 3H, the ultraviolet contact plug V1 is formed on the upper surface 21' and in contact with the N-type region 23, wherein the ultraviolet contact plug V1 is configured to operably collect the ultraviolet current caused by electron-hole pairs generated by the incident light LT1. As shown in FIG. 3H, a non-ultraviolet contact plug V2 is formed on the upper surface 21' and in contact with the N-type conductive channel 25, wherein the non-ultraviolet contact plug V2 is configured to operably collect the non-ultraviolet current caused by electron-hole pairs generated by the incident light LT1. As shown in FIG. 3H, a contact plug V is formed on the upper surface 21' and in contact with one of the gates 31. As shown in FIG. 3H, dielectric layers IDLs and metal lines M1*s* are formed. The dielectric layers IDLs and metal lines M1*s* are well known to those skilled in this art and therefore details thereof are omitted here. The gates 31, the contact plug V indicate other circuits formed in the silicon substrate 21. Therefore, the silicon ultraviolet photodiode 20 can be manufactured in the same silicon substrate 21 with circuit elements.

The present invention has been described in considerable detail having reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristic of the device, such as a threshold voltage adjustment region, etc., can be added. In view of the foregoing, the spirit of the present invention should cover all such and other modifications and variations, which should be interpreted to fall within the scope of the following claims and their equivalents. An embodiment or a claim of the present invention does not need to achieve all the objectives or advantages of the present invention. The title and abstract are provided for assisting searches but not for limiting the scope of the present invention.

What is claimed is:

1. A silicon ultraviolet photodiode, configured to operably sense an ultraviolet light of an incident light irradiating onto the silicon ultraviolet photodiode, the silicon ultraviolet photodiode comprising:

an N-type region formed beneath and in contact with an upper surface of a silicon substrate;

a P+ region formed beneath and in contact with the N-type region;

a deep N-well region formed beneath and in contact with the P+ region; and an N-type conductive channel, which is connected to the deep N-well region, and is configured to operably drain a non-ultraviolet current caused by electron-hole pairs generated by the incident light;

wherein a depth of the N-type region is controlled to a predetermined depth to enhance an ultraviolet sensitivity by compensating N-type dopant impurities of an N-type implantation region by out-diffused P-type dopant impurities of a P+ implantation region through a thermal process step.

2. The silicon ultraviolet photodiode of claim 1, further comprising an ultraviolet contact plug, which is formed on the upper surface and in contact with the N-type region, wherein the ultraviolet contact plug is configured to operably collect an ultraviolet current caused by electron-hole pairs generated by the incident light.

3. The silicon ultraviolet photodiode of claim 1, wherein the N-type region is configured to operably receive a UVA light with a wave length not larger than 400 nm and not less than 320 nm, a UVB light with a wave length less than 320 nm and not less than 280 nm, and/or a UVC light with a wave length less than 280 nm and not less than 100 nm.

4. The silicon ultraviolet photodiode of claim 1, wherein the predetermined depth is less than 10 nm.

5. The silicon ultraviolet photodiode of claim 1, wherein the silicon ultraviolet photodiode does not comprise a filter for filtering out a visible signal and/or an IR signal.

6. The silicon ultraviolet photodiode of claim 1, wherein the N-type implantation region is formed beneath and in contact with an upper surface of the silicon substrate;

wherein the P+ implantation region is formed above the deep N-well region and below the N-type implantation region;

wherein the N-type region and the P+ region are formed by performing the thermal process step to form the N-type region and the P+ region.

7. The silicon ultraviolet photodiode of claim 2, wherein a first PN junction is formed between the N-type region and the P+ region to sense the ultraviolet current;

wherein a second PN junction is formed between the P+ region and the deep N-well region to sense the non-ultraviolet current.

8. A manufacturing method of a silicon ultraviolet photodiode, wherein the silicon ultraviolet photodiode is configured to operably sense an ultraviolet light of an incident light irradiating onto the silicon ultraviolet photodiode, the manufacturing method comprising:

providing a silicon substrate;

forming a deep N-well region in the silicon substrate;

forming an N-type implantation region beneath and in contact with an upper surface of the silicon substrate;

forming a P+ implantation region above the deep N-well region and below the N-type implantation region;

performing a thermal process step to out-diffuse P-type dopant impurities of the P+ implantation region to compensate N-type dopant impurities of the N-type implantation region to form an N-type region and a P+ region, so as to control a depth of the N-type region to a predetermined depth to enhance an ultraviolet sensitivity; and forming an N-type conductive channel, which is connected to the deep N-well region, and is configured to operably drain a non-ultraviolet current caused by electron-hole pairs generated by the incident light;

wherein the N-type region is beneath and in contact with an upper surface of the silicon substrate;

wherein the P+ region is beneath and in contact with the N-type region;

wherein the deep N-well region is beneath and in contact with the P+ region.

9. The manufacturing method of claim 8, further comprising forming an ultraviolet contact plug on the upper surface and in contact with the N-type region, wherein the ultraviolet contact plug is configured to operably collect an ultraviolet current caused by electron-hole pairs generated by the incident light.

10. The manufacturing method of claim 8, wherein the N-type region is configured to operably receive a UVA light with a wave length not larger than 400 nm and not less than 320 nm, a UVB light with a wave length less than 320 nm and not less than 280 nm, and/or a UVC light with a wave length less than 280 nm and not less than 100 nm.

11. The manufacturing method of claim 8, wherein the predetermined depth is less than 10 nm.

12. The manufacturing method of claim 8, wherein the silicon ultraviolet photodiode does not comprise a filter for filtering out a visible signal and/or an IR signal.

13. The manufacturing method of claim 9, wherein a first PN junction is formed between the N-type region and the P+ region to sense the ultraviolet current;

wherein a second PN junction is formed between the P+ region and the deep N-well region to sense the non-ultraviolet current.

* * * * *